(12) United States Patent
Wu et al.

(10) Patent No.: US 11,831,125 B2
(45) Date of Patent: Nov. 28, 2023

(54) STRUCTURE OF VERTICAL CAVITY SURFACE EMITTING LASER

(71) Applicant: TRUELIGHT CORPORATION, Hsinchu (TW)

(72) Inventors: Yen Hsiang Wu, Hsinchu (TW); Jia-Yu Lin, Hsinchu Citt (TW); Chih-Cheng Chen, Taoyuan County (TW)

(73) Assignee: TrueLight Corporation, Taiwan (TW)

( * ) Notice: Subject to any disclaimer, the term of this patent is extended or adjusted under 35 U.S.C. 154(b) by 553 days.

(21) Appl. No.: 16/884,787

(22) Filed: May 27, 2020

(65) Prior Publication Data
US 2020/0403377 A1    Dec. 24, 2020

(51) Int. Cl.
| | |
|---|---|
| *H01S 5/00* | (2006.01) |
| *H01S 5/042* | (2006.01) |
| *H01S 5/183* | (2006.01) |
| *H01S 5/323* | (2006.01) |
| *H01S 5/187* | (2006.01) |
| *H01S 5/20* | (2006.01) |

(52) U.S. Cl.
CPC ........ *H01S 5/04256* (2019.08); *H01S 5/1833* (2013.01); *H01S 5/18347* (2013.01); *H01S 5/18352* (2013.01); *H01S 5/18369* (2013.01); *H01S 5/32316* (2013.01); *H01S 5/187* (2013.01); *H01S 5/18313* (2013.01); *H01S 5/2063* (2013.01)

(58) Field of Classification Search
CPC .... H01S 5/1837; H01S 5/18369; H01S 5/187; H01S 5/32316; H01S 5/04256; H01S 5/18352; H01S 5/1833; H01S 5/18313; H01S 5/2063
See application file for complete search history.

(56) References Cited

U.S. PATENT DOCUMENTS

| | | | | |
|---|---|---|---|---|
| 4,949,350 | A  * | 8/1990 | Jewell | H01S 5/18305 |
| | | | | 372/45.01 |
| 5,468,656 | A  * | 11/1995 | Shieh | H01S 5/18308 |
| | | | | 438/42 |
| 9,929,536 | B1 * | 3/2018 | Lin | H01S 5/18344 |
| 10,224,692 | B2 * | 3/2019 | Onishi | H01S 5/1071 |
| 2020/0106245 | A1 * | 4/2020 | Barve | H01S 5/04254 |
| 2020/0313391 | A1 * | 10/2020 | Li | H01S 5/18341 |

* cited by examiner

*Primary Examiner* — Kinam Park

(57) ABSTRACT

A structure of Vertical Cavity Surface-Emitting Laser (VC-SEL) comprises an ion-implanted region with gas-furnace configuration arranged in the second mirror layer around a laser light output window, in order to retain several conductive passages between the inner and outer rims of the ion-implanted region, so as to let the aperture of the inner rim of the metal layer (that is, the aperture of the output window) be expanded without loss of resistance. Not only the shading effect can be removed, the spectrum width suppression function can be preserved, but also various photoelectric characteristics such as transmission eye diagram and photoelectric curve linearity can be improved, in addition, high-speed transmission characteristics can also be optimized.

6 Claims, 6 Drawing Sheets

STRUCTURE OF VERTICAL CAVITY SURFACE EMITTING LASER

This application claims the benefit of Taiwan Patent Application Serial No. 108121105, filed on Jun. 18, 2019, the subject matter of which is incorporated herein by reference.

BACKGROUND OF INVENTION

1. Field of the Invention

The invention relates to a structure of Vertical Cavity Surface Emitting Laser (VCSEL), and more particularly to a VCSEL structure that comprises an ion-implanted region with gas-furnace configuration arranged around an output window of laser in order to control the modes, confine the current, and improve the eye diagram.

2. Description of the Prior Art

The VCSEL (Vertical Cavity Surface Emitting Laser) is one of emitting laser diodes. Since the VCSEL needs smaller power and is less expensive, the features of higher speeds and lower cost have made the VCSEL popular in local networking. Light-emitting and light-detecting materials for producing the VCSEL include mainly GaAs and InP. Generally, the metal-organic chemical vapor deposition (MOCVD) is adopted to produce the epitaxial wafer for the VCSELs. In comparison with a typical edge-emitting laser, the resonant chamber and mirrors for reciprocally exciting photos in the resonant chamber of the VCSEL are not the crystal lattice boundaries naturally formed during the manufacturing process, but already formed during the growth of the epitaxy of the epitaxial wafer for the VCSELs.

Generally, a typical VCSEL structure largely includes a light-emitting active layer, a resonant chamber and two distributed Bragg reflectors (DBR) with high reflectivity. When photos are generated in the light-emitting active layer, they would oscillate reciprocally inside the resonant chamber. As soon as any photo reaches the population inversion, a corresponding laser light would be formed on a surface of the VCSEL. Since the VCSEL adopts a surface-emitting laser, the induced laser light would be shaped into a cone, which is easier to couple with an optical fiber, without additional optical lens. For basic structuring, manufacturing and operating of the conventional VCSEL structure, please refer to U.S. Pat. Nos. 4,949,350 and 5,468,656.

This invention is provided to improve the aforesaid conventional VCSEL structure. By introducing a specific ion-implanted region with gas-furnace configuration arranged around a light output window to control the optical modes, confine the current path, and improve the eye diagram, the light shape can be more stable with fewer drop points, the linearity of the photoelectric curve can be improved, and the same or lower resistance value can be maintained.

SUMMARY OF THE INVENTION

Accordingly, it is the primary objective of the present invention to provide a structure of VCSEL, which utilizes a specific ion-implanted region with a gas-furnace liked configuration arranged around an output window to control the optical modes, confine the current path, and improve the eye diagram; such that, the light shape can be more stable with fewer drop points, the linearity of the photoelectric curve can be improved, and the same or lower resistance value can be maintained.

In order to achieve the aforementioned objective, the present invention provides a VCSEL structure which comprises:

a substrate;

a first mirror layer, located on the substrate;

an active region, located on the first mirror layer;

a second mirror layer, located on active region and having an upper surface;

an oxide layer, located in the second mirror layer and having a central opening;

a mesa, located on the substrate, structured by at least a portion of the first mirror layer, the active region, the second mirror layer and the oxide layer; an output window being included in a central area of a top surface of the mesa; the output window is corresponding to the central opening;

an isolation trench, located in and surrounding at least a portion of a periphery of the mesa; said isolation trench penetrating downward through the second mirror layer, the oxide layer and the active region from the top surface of the mesa; the isolation trench being filled with a dielectric material;

a metal layer, located on the top surface of the mesa and circling at least a portion of an outer periphery of the output window; said metal layer at least including an inner rim contacting the upper surface of the second mirror layer; a diameter of the output window being defined by an inner diameter of the inner rim of the metal layer; and an ion-implanted region, at least located in the mesa;

wherein:

the ion-implanted region is an insulating area formed by implanting a plurality of non-conductive elements in the second mirror layer; the ion-implanted region extends downward from the upper surface of the second mirror layer into the second mirror layer by a predetermined depth; in addition, the ion-implanted region in the mesa is located between the output window and the isolation trench, and is surrounding at least a part of the outer periphery of the output window;

when viewing downwardly from top of the mesa, the ion-implanted region has an arc-shaped inner rim, an arc-shaped outer rim and at least one conductive channel extends outward from the arc-shaped inner rim toward the arc-shaped outer rim by a predetermined length in such a manner that, an outer end portion of the conductive channel is at least outwardly exceeding the arc-shaped inner rim of the metal layer;

there are no said non-conductive elements being implanted in the conductive channel;

the metal layer located above the conductive channel directly contacts the upper surface of the second mirror layer;

the diameter of the arc-shaped inner rim of the ion-implanted region is smaller than the inner diameter of the inner rim of the metal layer; that is, the diameter of the arc-shaped inner rim of ion-implanted region is smaller than the diameter of the output window.

In a preferred embodiment, the non-conductive elements comprise at least one of the following: protons and oxygen ions.

In a preferred embodiment, the diameter of the arc-shaped inner rim of the ion-implanted region is smaller than the diameter of the central opening of the oxide layer; in addition, the diameter of the output window is larger than the diameter of the central opening of the oxide layer.

In a preferred embodiment, the ion-implanted region is formed with a plurality of conductive channels, and each of the conductive channels penetrates between the arc-shaped inner rim and the arc-shaped outer rim of the ion-implanted region; when viewing from top of the mesa, the plurality of conductive channels 543 divides the ion-implanted region into a plurality of separated fan-shaped sectors similar to a gas-furnace configuration.

In a preferred embodiment, wherein:
the VCSEL structure further comprises an isolating layer and a power output layer; said isolating layer covers at least a portion of an outer surface of the mesa, and at least a portion of the metal layer is exposed out of the isolating layer; the power output layer is located on the output window of the top surface of the mesa;
the first mirror layer is an n-type distributed Bragg reflector (DBR) layer, while the second mirror layer is a p-type DBR layer;
materials of the first mirror layer and the second mirror layer include AlGaAs with various Al mole percentages, wherein the oxide layer of the second mirror layer contains Al with a relative high mole percentage;
the oxide layer at least extends horizontally from an inner rim of the isolation trench toward a center of the mesa to an outer rim of the central opening;
the dielectric material is a polymer material with low dielectric properties.

In a preferred embodiment, the diameter of the central opening of the oxide layer is between 5 μm and 15 μm; the diameter of the inner rim of the metal layer is between 8 μm and 20 μm; the predetermined depth of the ion-implanted region is between 1 μm and 4 μm; the diameter of the arc-shaped inner rim of the ion-implanted region is between 4 μm and 14 μm; the diameter of the arc-shaped outer rim of the ion-implanted region is between 20 μm and 40 μm; the width of each said conductive channel is between 1 μm and 5 μm.

All these objectives can be achieved by the structure of VCSEL described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a structure of Vertical Cavity Surface-Emitting Laser (VCSEL). In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

The structure of VCSEL in accordance with the present invention mainly applies an ion-implanted region with gas-furnace configuration arranged in the second mirror layer around a light output window, in order to retain several conductive passages between the inner and outer rims of the ion-implanted region, so as to let the aperture of the inner rim of the metal layer (that is, the aperture of the output window) be expanded without loss of resistance. Not only the shading effect can be removed, the spectrum width suppression function can be preserved, but also various photoelectric characteristics such as transmission eye diagram and photoelectric curve linearity can be improved, in addition, high-speed transmission characteristics can also be optimized.

Figure 1:
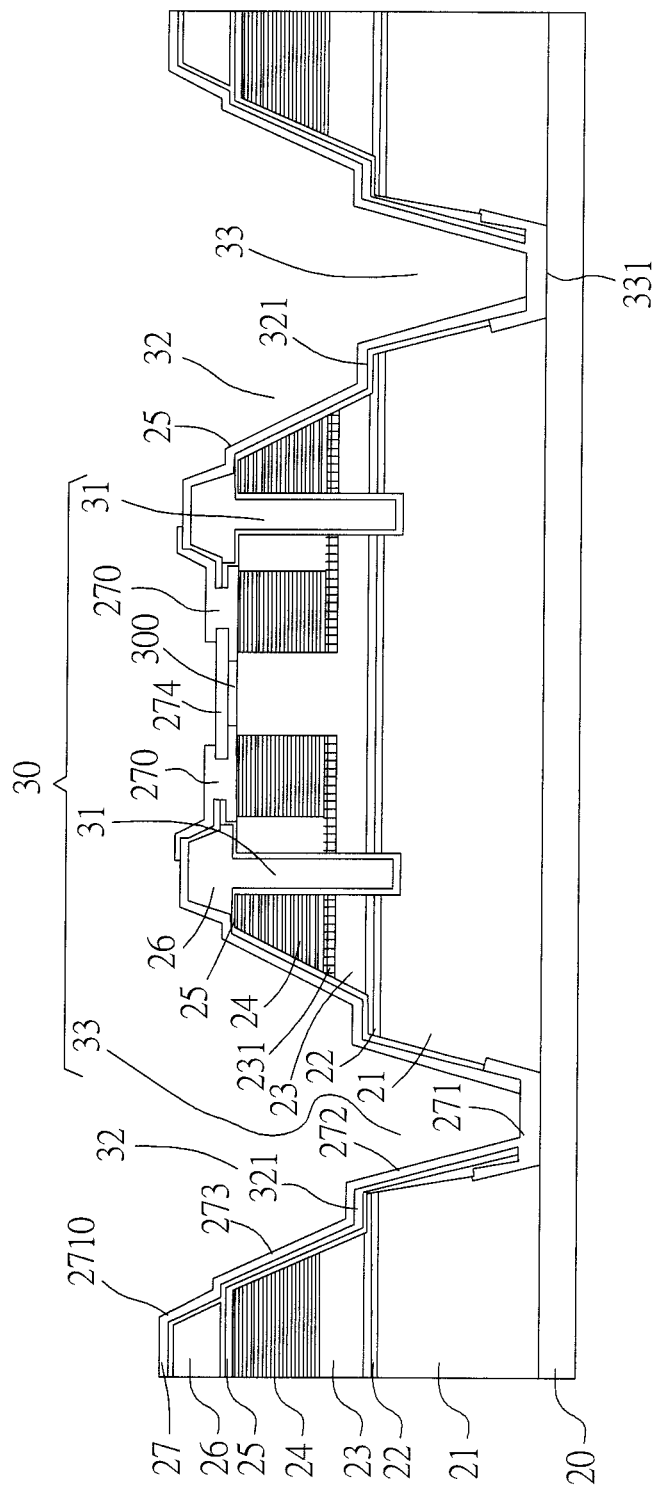
FIG. 1 is a schematic cross-sectional view of a typical embodiment of a VCSEL structure developed by the same applicant of the present invention.

Referring now to FIG. 1, a schematic cross-sectional view of a typical embodiment of a VCSEL structure developed by the same applicant of the present invention.

In this embodiment, the VCSEL structure is constructed on a laser-chip base material mainly made of a GaAs (Gallium Arsenide) or InP (Indium Phosphide) material. The base material includes, in an upward order, a substrate 20, a first mirror layer 21 located on the substrate 20, an active region (also referred as QW) 22 located on the first mirror layer 21, and a second mirror layer 23 located on the active region 22. Within the second mirror layer 23, an oxide layer 231 is located. In this embodiment, the first mirror layer 21 is an n-type distributed Bragg reflector (DBR) layer, or called as a lower mirror. On the other hand, the second mirror layer 23 is a p-type DBR layer, or called as an upper mirror layer. Both the first mirror layer 21 and the second mirror layer 23 contain multi-layer structures made of AlGaAs with various Al mole percentages. In particular, the oxide layer 231 of the second mirror layer 23 contains Al with a relative highest mole percentage. Thereupon, while in the oxidation process, the oxide layer 231 can form an insulation $Al_2O_3$ layer.

In the VCSEL structure of the present invention, the base material further includes a mesa 30, a first isolation trench 31, a second isolation trench 32, a third isolation trench 33, a dielectric material 26, a first contact layer 270, a second contact layer 271-273, an ion-implanted region 24, an isolating layer 25 and a power output layer 274.

The mesa 30 located on the substrate 20 is made up of at least a portion of the first mirror layer 21, the active region 22, the second mirror layer 23 and the oxide layer 231. An output window 300 is formed at a central area of a top surface of the mesa 30. In this embodiment, the oxide layer 231 is high enough to be close to a bottom portion of the ion-implanted region 24, and even part thereof is overlapping a bottom portion of the ion-implanted region 24. The first isolation trench 31 is located in the mesa 30, and circles at least a portion of the periphery of the output window 300. The first isolation trench 31 extends downward from the top surface of the mesa 30, and penetrates at least the second mirror layer 23, the oxide layer 231 and the active region 22, such that the bottom portion of the first isolation trench 31 can reach the first mirror layer 21. The second isolation trench 32 circles at least a portion of the periphery of the upper part of the mesa 30, and is spaced from the first isolation trench 31 by a gap. The second isolation trench 32 extends downward to penetrate at least the second mirror layer 23 and the oxide layer 231, such that a bottom portion 321 of the second isolation trench 32 can be located at one of the active region 22 and the first mirror layer 21. The oxide layer 231 extends horizontally from an inner rim of the first isolation trench 31 toward the center of the mesa 30. The third isolation trench 33 circles at least a portion of the periphery of the lower part of the mesa 30, and is concave down from the bottom portion 321 of the second isolation trench 32. Also, the third isolation trench 33 penetrates downward at least the first mirror layer 21 (or penetrates the active region 22 and the first mirror layer 21), such that a bottom portion 331 of the third isolation trench 33 can be located at the upper surface of the substrate 20.

In this embodiment, the dielectric material 26, preferable a polymer material with low dielectric properties, is to fill at least the first isolation trench 31 so as to reduce the overall capacitance of the VCSEL structure. In this embodiment, the dielectric material 26 is a polymer, for example a polymide, with a reflective index of 1.5~1.6. In this present invention, the resort of digging out the first isolation trench 31 and then filling with a polymer (dielectric material 26) can reduce substantially the area of the semiconductor material that is featured in a high dielectric index, and thereby the corresponding capacitance can be reduced. The first contact layer 270 and the second contact layer 271~273 is part of the metal layer 27. The first contact layer 270 is located on the top surface of the mesa 30, and contacts an upper surface 240 of the second mirror layer 23. The second contact layer 271, 272, 273 is at least located at the bottom portion 331 of the third isolation trench 33, and at least contacts the substrate 20. In this embodiment, the second contact layer 271, 272, 273 is extended upward to the upper surface 240 of the second mirror layer 23 along respective oblique surfaces of the third isolation trench 33 and the second isolation trench 32 from the bottom portion 331 of the third isolation trench 33, such that a top surface 2710 of the second contact layer 271, 272, 273 can be largely flush with the top surface of the first contact layer 270. Hence, in the present invention, the first contact layer 270 and the second contact layer 271, 272, 273 are both located one the same surface of the substrate 10, and also reach substantially the same height, from which the following wire bonding could be much easier. In addition, a plane is formed at the bottom portion 321 of the second isolation trench 32, and thus the second contact layer 271, 272, 273 can be in a horizon-extending state at the bottom portion 321 of the second isolation trench 32. Thereupon, a step-like structure having double mesa-layers thus be formed to provide a broader lower mesa for enlarging the heat-radiating area and thereby for better reducing the thermal effects. Also, the two-stage concave second and third isolation trenches 32, 33 contribute to reduce the slopes of the corresponding oblique surfaces, and further the bottom portion 321 of the second isolation trench 32 is formed as a plane, such that, while the second contact layer 271, 272, 273 is under plating, sputtering or evaporating for forming the metal layer, possible metal-gap defects can be effectively prevented.

The ion-implanted region 24 in the second mirror layer 23 is located above the active layer 22. By varying corresponding aperture size of the oxide layer 231 and the ion-implanted region 24, the optical mode can thus be controlled. In the present invention, the ion implantation is gain-guided, but the oxidation is index-guided. The control of the optical mode can be achieved by the hybrid application of the ion implantation process and the oxidation process. Further, the ion-implanted region 24 in the mesa 30 is located between the output window 300 and the first isolation trench 31 by circling at least a portion of the periphery of the output window 300. Also, the first contact layer 270 contacts an upper surface of the ion-implanted region 24. In the present invention, additional ion-implanted region 24 located at the periphery of the output window 300 can be used to control the optical mode and to confine the current path. In this embodiment, the ion-implanting process can implant protons or oxygen ion at a depth of 2~4 μm.

In this embodiment, multiple implementation modes of different energies can be added for the same ion implantation process; taking proton as an example, the implanting process can be performed with three different energies of 100 Kev+200 Kev+300 Kev, if the element used is different, then the energy applied is also different. In another embodiment, it can also be achieved by combining with multiple elements (for example: oxygen+boron+hydrogen), and, taking proton as an example, the range of its quantity can be between 1e14~1e15 $cm^{-3}$. The isolating layer 25 is to cover at least a portion of an outer surface of the mesa 30, and at least a portion of the first contact layer 270 and the second contact layer 271, 272, 273 are exposed out of the isolating layer 25. The power output layer 274, located on the output window 300 of the top surface of the mesa 30, is to control the output light, according to the refractive index, thickness and optical wavelength of the power output layer 274. In the present invention, the material for the power output layer 274 can be $Si_3N_4$, $SiO_2$, $Si_3O_4$, SiN, SiNO or the like. In particular, in this embodiment, the power output layer 274 can be made of a dielectric material; for example, $SiO_2$, SiN or a mixture of the aforesaid two with a reflective index of 1.5~2.0.

Although the VCSEL structure shown in FIG. 1 is furnished with an ion-implanted region 24 located at the periphery of the output window 300 to control the optical mode and to confine the current path, however, the specific structural design of the ion-implantation region 24 still has its shortcomings, which will be described below.

Figure 2A:
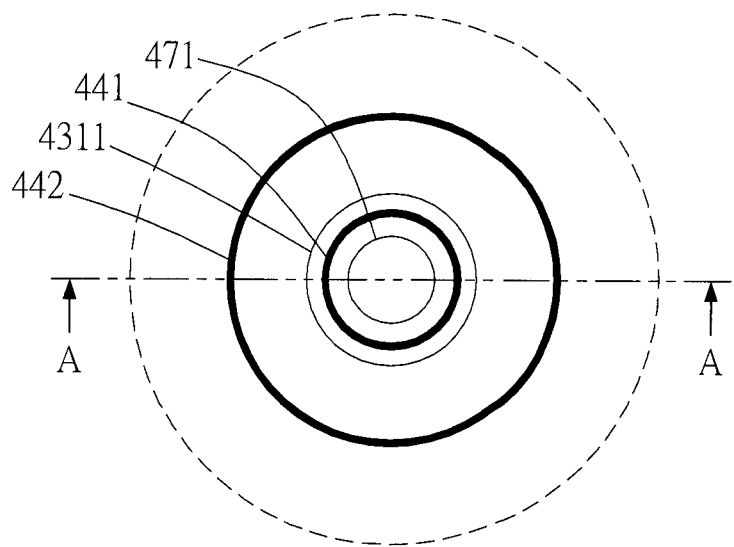
FIG. 2A is a diagram schematically showing a top view of the relative positions of the inner rim of metal layer, the inner and outer rims of ion-implanted region, and the inner rim of oxide layer of the embodiment of VCSEL structure shown in FIG. 1.
Figure 2B:
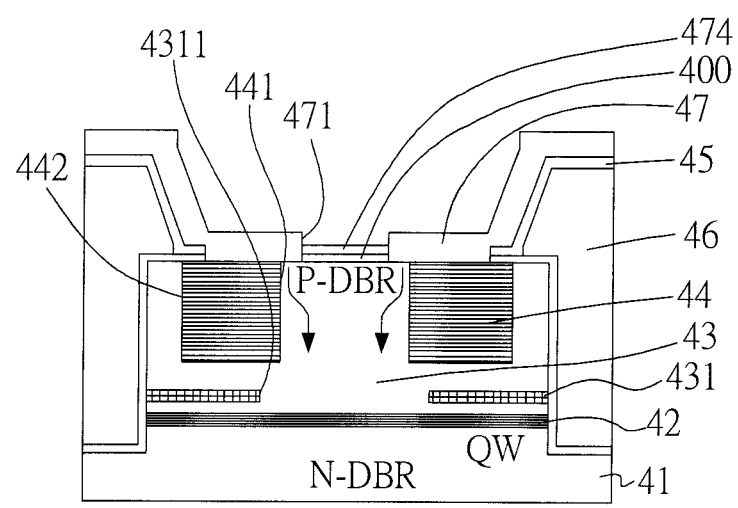
FIG. 2B is the A-A sectional view of FIG. 2A, which schematically shows the cross-sectional structure of the mesa of the embodiment of VCSEL structure shown in FIG. 1.

Please refer to FIG. 2A and FIG. 2B. In which, FIG. 2A is a diagram schematically showing a top view of the relative positions of the inner rim of metal layer, the inner and outer rims of ion-implanted region, and the inner rim of oxide layer of the embodiment of VCSEL structure shown in FIG. 1. FIG. 2B is the A-A sectional view of FIG. 2A, which schematically shows the cross-sectional structure of the mesa of the embodiment of VCSEL structure shown in FIG. 1. In this embodiment shown in FIG. 2A and FIG. 2B, because the structures, locations, sizes and materials of the first mirror layer 41, active region 42, second mirror layer 43, oxide layer 431, ion-implanted region 44, isolation layer 45, dielectric material 46, metal layer 47, power output layer 474 and output window 400 are all substantially the same with the corresponding components of the embodiment shown in FIG. 1, and can directly follow the previous descriptions, and thus will not be repeatedly described in detail below.

The VCSEL structures shown in FIG. 1 and FIGS. 2A and 2B use the oxidation (oxide layer 431) and ion implantation (ion-implanted region 44) technologies to define the current injection intervals and luminous apertures, and also control the optical mode and the limited current by controlling the difference between the sizes of central apertures of the oxide layer 431 and the ion-implanted region 44, in order to optimize the trade-off between the spectral width and the threshold current. However, because the elements implanted in the ion-implanted region 44 are non-conductive elements, therefore, except for the area which is located in the inner rim of the ion-implanted region 44 and has not been ion-implanted, other areas will be non-conductive; as a result, the diameter of the inner rim of the metal layer 47 must be smaller than the diameter of the inner rim of the ion-implanted region 44. Therefore, the diameters/sizes of openings defined by the three inner rims will be: the diameter of opening defined by the inner rim 4311 of the oxide layer 431≥the diameter of opening defined by the inner rim 441 of the ion-implanted region 44>the diameter of opening defined by the inner rim 471 of the metal layer 47. Only in this way, the inner rim 471 of the metal layer 47 can directly contact the upper surface of the second mirror layer 43 where is a conductive area located within the inner rim 441 of the ion-implanted region 44 and is not subjected to ion implantation, so as to conduct electric current. Since the metal layer 47 itself is an opaque material, it can be understood from the above configuration that the elemental design of the above described VCSEL structure is essentially subjected to the light-shielding phenomenon; wherein, the diameter of the output window 400 of laser light is directly and inevitably defined by the aperture/opening defined by the inner rim 471 of the metal layer 47; and, in the meantime, the light-shielding phenomenon is used to suppress the spectral width for the second time. Although such structural design can still be used for high-frequency optical signal modulation in a very small processing space, however, once the tolerance range is exceeded, the photoelectric curve will have a two-stage slope due to the light-shading phenomenon, which will cause degradation of high-frequency signal, and can't be filtered by any spot measurement parameters; moreover, it will also cause the products of different batches to have different eye diagram performances, and thus leaves a room for further improvements.

In order to improve the foregoing disadvantages of the above described VCSEL structures shown in FIG. 1 and FIGS. 2A and 2B, the present invention discloses a novel design of VCSEL structure which retains several conductive channels by modifying the pattern of the ion-implanted region, such that, the aperture/opening defined by the inner rim of metal layer can be enlarged without losing the electrical resistance. As a result, not only the shading effect can be removed, and the function of spectrum wide suppression can be retained, but also the two-stage slope of photoelectric curve can be avoided, various photoelectric characteristics such as linearity can be improved, as well as the high-speed transmission characteristics can also be optimized.

Figure 3A:
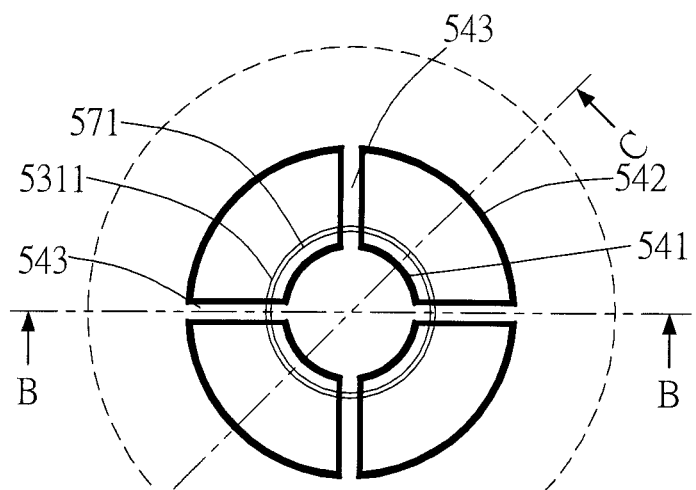
FIG. 3A is a diagram schematically showing a top view of the configurations and relative positions of the inner rim of metal layer, the inner and outer rims of ion-implanted region, and the inner rim of oxide layer of a preferred embodiment of the VCSEL structure in accordance with the present invention.
Figure 3B:
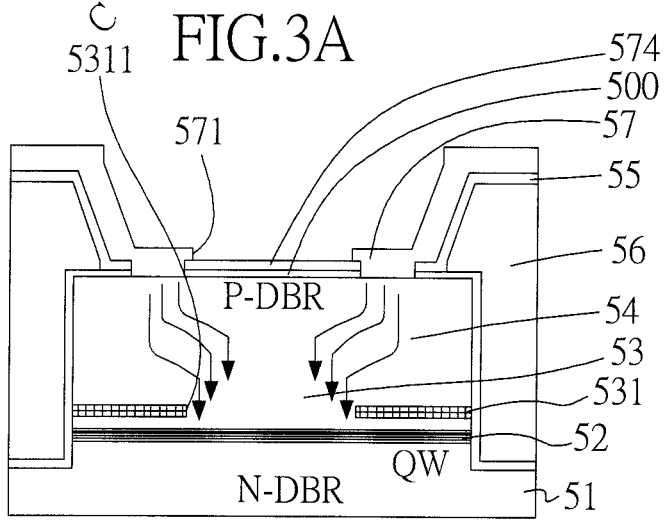
FIG. 3B is the B-B sectional view of FIG. 3A, which schematically shows the B-B cross-sectional structure of the mesa of the embodiment of VCSEL structure of the present invention.
Figure 3C:
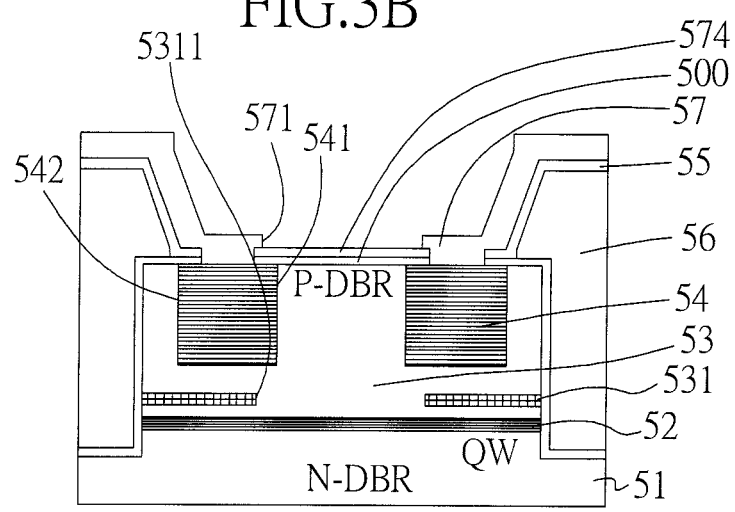
FIG. 3C is the C-C sectional view of FIG. 3A, which schematically shows the C-C cross-sectional structure of the mesa of the embodiment of VCSEL structure of the present invention.

Please refer to FIG. 3A, FIG. 3B and FIG. 3C. In which, FIG. 3A is a diagram schematically showing a top view of the configurations and relative positions of the inner rim of metal layer, the inner and outer rims of ion-implanted region, and the inner rim of oxide layer of a preferred embodiment of the VCSEL structure in accordance with the present invention. FIG. 3B is the B-B sectional view of FIG. 3A, which schematically shows the B-B cross-sectional structure of the mesa of the embodiment of VCSEL structure of the present invention. FIG. 3C is the C-C sectional view of FIG. 3A, which schematically shows the C-C cross-sectional structure of the mesa of the embodiment of VCSEL structure of the present invention. In this embodiment of the invention shown in FIG. 3A, FIG. 3B and FIG. 3C, because the structures, locations, sizes and materials of the substrate, first mirror layer 51, active region 52, second mirror layer 53, upper surface of second mirror layer 53, oxide layer 531, opening defined by the inner rim of oxide layer 531, mesa, top surface of mesa, trenches, ion-implanted region 54, isolation layer 55, dielectric material 56, metal layer 57, power output layer 574 and output window 500 are all substantially similar or the same with the corresponding components of the embodiment shown in FIG. 1, and can directly follow the previous descriptions, and thus will not be repeatedly described in detail below.

Specifically speaking, in this embodiment shown in FIG. 3A, FIG. 3B and FIG. 3C, the VCSEL structure of the invention is also constructed on a laser-chip base material mainly made of a GaAs (Gallium Arsenide) or InP (Indium Phosphide) material, and also comprises a substrate (not shown in these figures), a first mirror layer 51, an active region (also referred as QW) 52, a second mirror layer 53, an oxide layer 531, a mesa, a trench (where the dielectric material 56 is filled), a metal layer 57 and an ion-implanted region 54. The first mirror layer 51 is located on the substrate. The active region 52 is located on the first mirror layer 51. The second mirror layer 53 is located on the active region 22 and has an upper surface. The oxide layer 531 is located within the second mirror layer 23, wherein a central opening is defined by the inner rim 5311 of the oxide layer 531. The oxide layer 531 at least extends horizontally from an inner rim of the isolation trench toward a center of the mesa to an outer rim of the central opening (defined by the inner rim 5311).

The mesa is located on the substrate and is made up of at least a portion of the first mirror layer 51, the active region 52, the second mirror layer 53 and the oxide layer 531. An output window 500 is formed at a central area of a top surface of the mesa. The output window 500 is located right above and is corresponding to the central opening defined by the inner rim 5311 (central opening) of the oxide layer 531.

The trench (where the dielectric material 56 is filled) circles at least a portion of the outer periphery of the mesa. The trench (where the dielectric material 56 is filled) extends downward from the top surface of the mesa, and penetrates at least the second mirror layer 53, the oxide layer 531 and the active region 52, such that the bottom portion of the trench (where the dielectric material 56 is filled) can reach the first mirror layer 51. The trench is filled with the dielectric material 56 to act as an isolation trench circling around the outer periphery of mesa. The metal layer 57 is located on the top surface of the mesa and is surrounding the outer periphery of the output window 500, in addition, so at least an inner rim 571 of the metal layer 57 is contacting the upper surface of the second mirror layer 53. The diameter of the output window 500 is defined by the diameter of the opening defined by the inner rim 571 of the metal layer 57. The ion-implanted region 54 is located at least in the mesa. A power output layer 574 is furnished on the top of the output window 500.

In this embodiment, the ion-implanted region 54 is an insulating region formed by implanting non-conductive elements (such as, but not limited to, protons or oxygen ions) into the second mirror layer 53. The ion-implanted region 54 extends downward from the upper surface of the second mirror layer 53 into the second mirror layer 53 by a predetermined depth, in addition, the ion-implanted region 54 in the mesa is located between the output window 500 and the trench (where the dielectric material 56 is filled), and is surrounding at least a part of the outer periphery of the output window 500. When viewing downwardly from top of the mesa, the ion-implanted region 54 has an arc-shaped inner rim 541, an arc-shaped outer rim 542 and at least one conductive channel 543 extends outward from the arc-shaped inner rim 541 toward the arc-shaped outer rim 542 by a predetermined length in such a manner that, an outer end portion of the conductive channel 543 is at least outwardly exceeding the inner rim 571 of the metal layer 57. In a preferred embodiment of the invention, the ion-implanted region 54 is formed with a plurality of conductive channels 543, and each of the conductive channels 543 penetrates between the arc-shaped inner rim 541 and the arc-shaped outer rim 542 of the ion-implanted region 54. As shown in FIG. 3A, when viewing from the top view, the plurality of conductive channels 543 cuts/divides the ion-implanted region 54 into a plurality of separated fan-shaped sectors similar to a gas-furnace configuration. Since no protons and oxygen ions are implanted in the conductive channels 543, these conductive channels 543 belong to a part of the conductive second mirror layer 53 that can conduct electricity. Therefore, as shown in FIG. 3B, it can be seen from the cross-sectional view along the B-B section line that, the metal layer 57 located above these conductive channels 543 can directly contact the upper surface of the conductive second mirror layer 53, so that the electric current applied to the metal layer 57 can enter the second mirror layer 53 through the plurality of conductive channels 543. In the other hand, as shown in FIG. 3C, it can be seen from the cross-sectional view along the C-C section line that, except for the portion of metal layer 57 being located above the conductive channels 543, other portions of the metal layer 57 located on other regions will not be able to conduct electric current because the lower surface thereof can only contact the insulated ion-implanted region 54. By means of such novel gas-furnace configuration of ion-implanted region 54, although the diameter of the output window 500 is still defined by the inner rim 571 of the opaque metal layer 57, however, the diameter of the inner rim 571 of the metal layer 57 in the present invention is no longer required to be smaller than the diameter of the arc-shaped inner rim 541 of the ion-implanted region 54. That means, in the present invention, the diameter of the arc-shaped inner rim 541 of the ion-implanted region 54 is smaller than the inner diameter of the inner rim 571 of the metal layer 57; that is, the diameter of the arc-shaped inner rim 541 of ion-implanted region is smaller than the diameter of the output window 500. Moreover, the diameter of the arc-shaped inner rim 541 of the ion-implanted region 54 is smaller than the diameter of the central opening (inner rim 5311) of the oxide layer 531; in addition, the diameter of the output window 500 (that is, the diameter of the inner rim 571 of the metal layer 57) is larger than the diameter of the inner rim 5311 (central opening) of the oxide layer 531; and furthermore, the diameter of the arc-shaped outer rim 542 of the ion-implanted region 54 is larger than the diameter of the inner rim 5311 (i.e., the central opening) of the oxide layer 531. As a result, the Vertical Cavity Surface-Emitting Laser (VCSEL) of the present invention is designed by designing the outline/contour of the ion-implanted region 54 in a manner similar to a gas-furnace rack (when viewing from its top view), in order to furnish one or several conductive channels 543 between the inner and outer rims 541,542 of the ion-implanted region 54, so as to confine the electric current to enter the second mirror layer 53 through the conductive channels 543. Not only the size of aperture of the output laser (that is, the size of output window 500, which is equal to the diameter of the inner rim 571 of metal layer 57) can be enlarged without loss of resistance, the shading effect can be removed, the spectrum width suppression function can be preserved, but also the two-stage slope of photoelectric curve can be avoided, and various photoelectric characteristics such as linearity can be improved, as well as the high-speed transmission characteristics can also be optimized.

In a preferred embodiment of the invention, the diameter of the inner rim 5311 (i.e., the central opening) of the oxide layer 531 is between 5 µm and 15 µm; the diameter of the inner rim 571 of the metal layer 57 is between 8 µm and 20 µm; the predetermined depth of the ion-implanted region 54 is between 1 µm and 4 µm; the diameter of the arc-shaped inner rim 541 of the ion-implanted region 54 is between 4 and 14 µm; the diameter of the arc-shaped outer rim 542 of the ion-implanted region 54 is between 20 µm and 40 µm; the number of the conductive channels 543 of the ion-implanted region 54 is four, and the width of each one of the conductive channel 543 is between 1 µm and 5 µm.

Figure 4A:
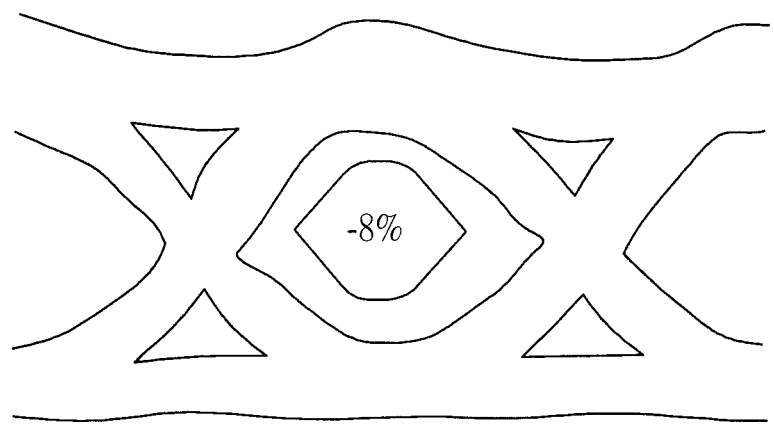
FIG. 4A is a transmission eye diagram (Eye Diagram) measured according to the conventional VCSEL structure (with output window aperture of 8 μm) as shown in FIG. 2A and FIG. 2B.
Figure 5A:
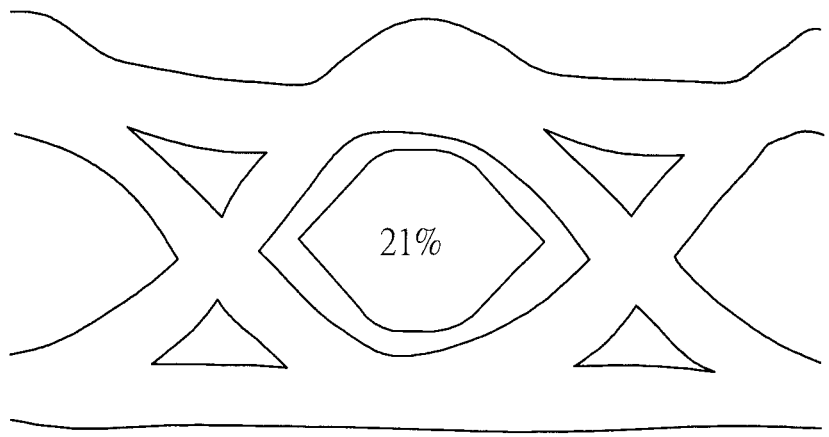
FIG. 5A is a transmission eye diagram (Eye Diagram) measured according to the VCSEL structure of the present invention (with output window aperture of 11 μm) as shown in FIG. 3A, FIG. 3B and FIG. 3C.
Figure 4B:
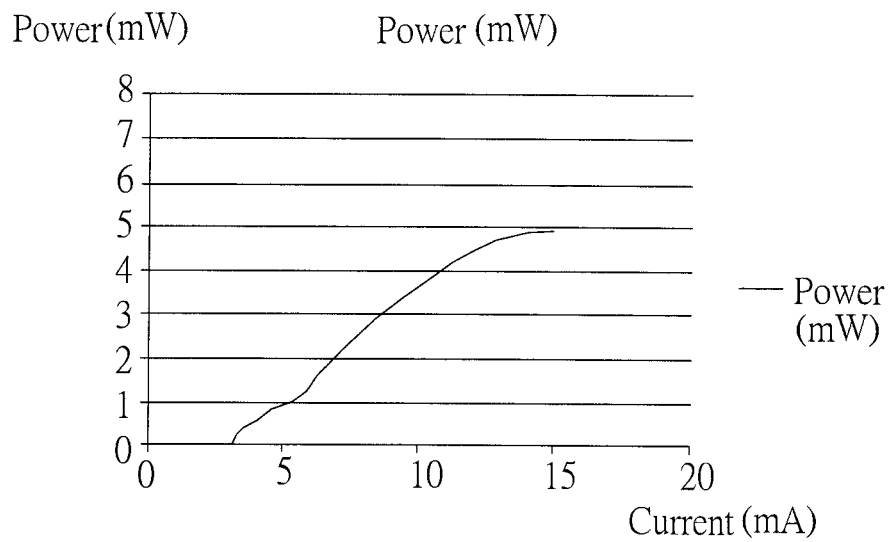
FIG. 4B is a photoelectric curve diagram of output optical power versus electric current (L-I) measured according to the conventional VCSEL structure (with output window aperture of 8 μm) as shown in FIG. 2A and FIG. 2B.
Figure 4C:
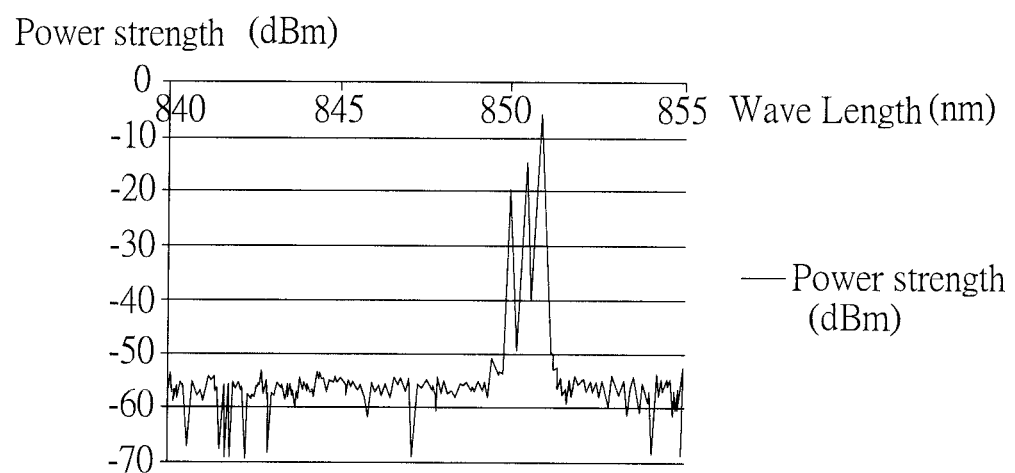
FIG. 4C is a spectral characteristic diagram of output light intensity versus wavelength measured according to the conventional VCSEL structure (with output window aperture of 8 μm) as shown in FIG. 2A and FIG. 2B.
Figure 5B:
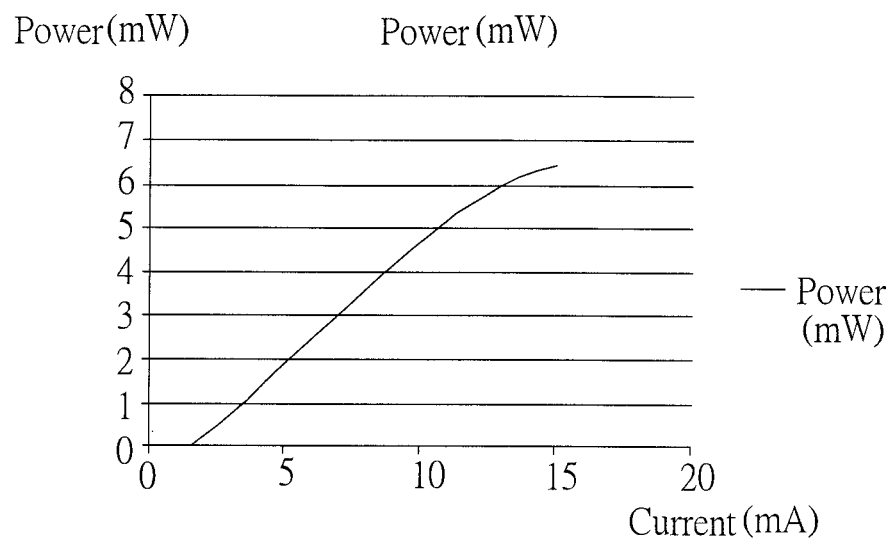
FIG. 5B is a photoelectric curve diagram of output optical power versus electric current (L-I) measured according to the VCSEL structure of the present invention (with output window aperture of 11 μm) as shown in FIG. 3A, FIG. 3B and FIG. 3C.
Figure 5C:
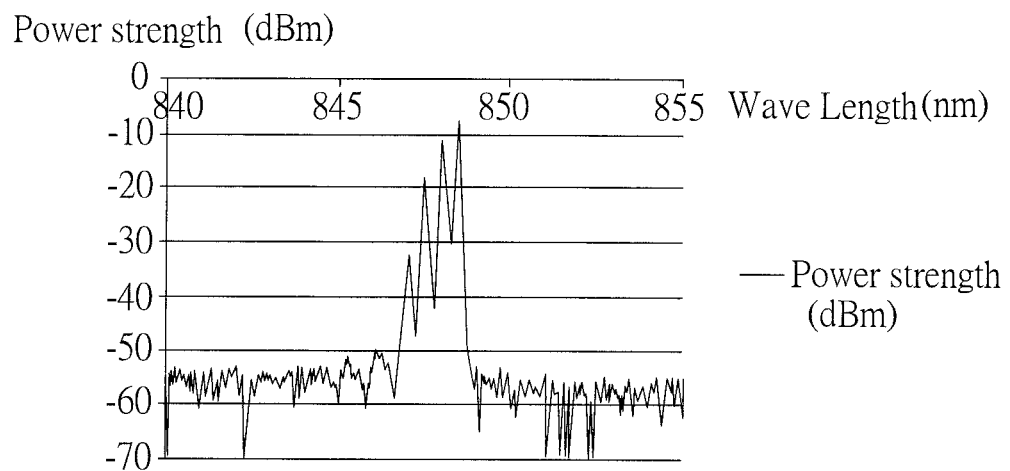
FIG. 5C is a spectral characteristic diagram of output light intensity versus wavelength measured according to the VCSEL structure of the present invention (with output window aperture of 11 μm) as shown in FIG. 3A, FIG. 3B and FIG. 3C.

Please refer to FIG. 4A, FIG. 4B and FIG. 4C, which respectively are the schematic diagrams of optical characteristics measured according to the conventional VCSEL structure (with output window aperture of 8 µm) as shown in FIG. 2A and FIG. 2B, including: the transmission eye diagram (Eye Diagram) shown in FIG. 4A, the photoelectric curve diagram of output optical power versus electric current (L-I) shown in FIG. 4B, and the spectral characteristic diagram of output light intensity versus wavelength shown in FIG. 4C. Please also refer to FIG. 5A, FIG. 5B and FIG. 5C, which respectively are the schematic diagrams of optical characteristics measured according to the VCSEL structure of the present invention (with output window aperture of 11 µm) as shown in FIG. 3A, FIG. 3B and FIG. 3C, including: the transmission eye diagram (Eye Diagram) shown in FIG. 5A, the photoelectric curve diagram of output optical power versus electric current (L-I) shown in FIG. 5B, and the spectral characteristic diagram of output light intensity versus wavelength shown in FIG. 5C. Comparing FIG. 4A and FIG. 5A, it can be seen that the VCSEL structure of the present invention can have relatively better performance in the transmission eye diagram, its light shape is more stable with fewer drop points, and thus can provide better high-speed transmission characteristics. Comparing FIG. 4B and FIG. 5B, it can be seen that, the curve shown in FIG. 4B presents a two-stage photoelectric curve; that is, the slope of the curve when the current is less than 10 mA is obviously different from the slope of the curve when the current is greater than 10 mA. In contrast, the photoelectric curve in FIG. 5B does not have the phenomenon of two-stage photoelectric curve, and has better linearity, and also has better performance in high frequency signals. It thus can be proved that, the VCSEL structure of the present invention has improved various optical characteristics such as the transmission eye pattern and the linearity of the photoelectric curve, etc., the high-speed transmission characteristics are also optimized, and has indeed improved the deficiencies of conventional technologies.

While the present invention has been particularly shown and described with reference to a preferred embodiment, it will be understood by those skilled in the art that various changes in form and detail may be without departing from the spirit and scope of the present invention.

What is claimed is:

1. A VCSEL structure, comprising:
a substrate;
a first mirror layer, located on the substrate;
an active region, located on the first mirror layer;
a second mirror layer, located on active region and having an upper surface;
an oxide layer, located in the second mirror layer and having a central opening;
a mesa, located on the substrate, structured by at least a portion of the first mirror layer, the active region, the second mirror layer and the oxide layer; an output window being included in a central area of a top surface of the mesa; the output window is corresponding to the central opening;
an isolation trench, located in and surrounding at least a portion of a periphery of the mesa; said isolation trench penetrating downward through the second mirror layer, the oxide layer and the active region from the top surface of the mesa; the isolation trench being filled with a dielectric material;
a metal layer, located on the top surface of the mesa and circling at least a portion of an outer periphery of the output window; said metal layer at least including an inner rim contacting the upper surface of the second mirror layer; a diameter of the output window being defined by an inner diameter of the inner rim of the metal layer; and
an ion-implanted region, at least located in the mesa;
wherein:
the ion-implanted region is an insulating area formed by implanting a plurality of non-conductive elements in the second mirror layer; the ion-implanted region extends downward from the upper surface of the second mirror layer into the second mirror layer by a predetermined depth; in addition, the ion-implanted region in the mesa is located between the output window and the isolation trench, and is surrounding at least a part of the outer periphery of the output window;
when viewing downwardly from top of the mesa, the ion-implanted region has an arc-shaped inner rim, an arc-shaped outer rim and at least one conductive channel extends outward from the arc-shaped inner rim toward the arc-shaped outer rim by a predetermined length in such a manner that, an outer end portion of the conductive channel is at least outwardly exceeding the arc-shaped inner rim of the metal layer;
there are no said non-conductive elements being implanted in the conductive channel;
the metal layer located above the conductive channel directly contacts the upper surface of the second mirror layer;
the diameter of the arc-shaped inner rim of the ion-implanted region is smaller than the inner diameter of the inner rim of the metal layer; that is, the diameter of the arc-shaped inner rim of ion-implanted region is smaller than the diameter of the output window.

2. The VCSEL structure of claim 1, wherein said non-conductive elements comprise at least one of the following: protons and oxygen ions.

3. The VCSEL structure of claim 1, wherein the diameter of the arc-shaped inner rim of the ion-implanted region is smaller than the diameter of the central opening of the oxide layer; in addition, the diameter of the output window is larger than the diameter of the central opening of the oxide layer.

4. The VCSEL structure of claim 1, wherein the ion-implanted region is formed with a plurality of conductive channels, and each of the conductive channels penetrates between the arc-shaped inner rim and the arc-shaped outer rim of the ion-implanted region; when viewing from top of the mesa, the plurality of conductive channels divide the ion-implanted region into a plurality of separated fan-shaped sectors similar to a gas-furnace configuration when viewing downwardly from top of the mesa.

5. The VCSEL structure of claim 1, wherein:
the VCSEL structure further comprises an isolating layer and a power output layer; said isolating layer covers at least a portion of an outer surface of the mesa, and at least a portion of the metal layer is exposed out of the isolating layer; the power output layer is located on the output window of the top surface of the mesa;
the first mirror layer is an n-type distributed Bragg reflector (DBR) layer, while the second mirror layer is a p-type DBR layer;
materials of the first mirror layer and the second mirror layer include AlGaAs with various Al mole percentages, wherein the oxide layer of the second mirror layer contains Al with a relative high mole percentage;
the oxide layer at least extends horizontally from an inner rim of the isolation trench toward a center of the mesa to an outer rim of the central opening;
the dielectric material is a polymer material with low dielectric properties.

6. The VCSEL structure of claim 1, wherein:
the diameter of the central opening of the oxide layer is between 5 μm and 15 μm;
the diameter of the inner rim of the metal layer is between 8 μm and 20 μm;
the predetermined depth of the ion-implanted region is between 1 μm and 4 μm;
the diameter of the arc-shaped inner rim of the ion-implanted region is between 4 μm and 14 μm;
the diameter of the arc-shaped outer rim of the ion-implanted region is between 20 μm and 40 μm;
the width of each said conductive channel is between 1 μm and 5 μm.

* * * * *